United States Patent [19]

Corfits et al.

[11] Patent Number: 5,027,254
[45] Date of Patent: Jun. 25, 1991

[54] APPARATUS FOR COOLING ELECTRONICS COMPONENTS

[75] Inventors: William D. Corfits; Maurice F. Holahan; Susan J. Martino; David R. Motschman, all of Rochester; James R. Thorpe, Stewartville, all of Minn.

[73] Assignee: International Business Machines Corporation, Armonk, N.Y.

[21] Appl. No.: 434,963

[22] Filed: Nov. 9, 1989

[51] Int. Cl.⁵ .............................................. H05H 7/20
[52] U.S. Cl. .................................. 361/384; 165/122; 361/415
[58] Field of Search ............... 361/412, 415, 416, 417, 361/393, 394, 383, 384, 381, 391; 439/64; 174/35 R, 35 C

[56] References Cited

U.S. PATENT DOCUMENTS

| | | | |
|---|---|---|---|
| 4,502,100 | 2/1985 | Greenspan et al. | 361/384 |
| 4,644,443 | 2/1987 | Swensen et al. | 361/384 |
| 4,876,630 | 10/1989 | Dara | 361/413 |

FOREIGN PATENT DOCUMENTS 3335110 9/1983 Fed. Rep. of Germany ...... 361/415

Primary Examiner—Leo P. Picard
Assistant Examiner—Donald A. Sparks
Attorney, Agent, or Firm—J. Michael Anglin; Roy W. Truelson

[57] ABSTRACT

A side-by-side double row of electronics packages plug into a common backplane. Cooling air flows in an (upside down) omega-shaped path turning into one row of packages, flowing through that row, turning through an air-moving device into a plenum chamber, then turning into the second row of packages, and out of the second row turning again to an outlet.

12 Claims, 6 Drawing Sheets

APPARATUS FOR COOLING ELECTRONICS COMPONENTS

BACKGROUND OF THE INVENTION

The present invention realtes to the physical packaging of electronics components, and more particularly relates to improved apparatus for cooling multiple cages or bays of components.

Many electronics systems use a packaging approach involving cages or bays which hold a number of individual cards, books, or other units of components, where the individual units are electrically connected to each other by means of a backplane bus. Data-processing systems, for example, commonly use this type of packaging.

The increasing density of electronics circuits and their increasing speed of operation both demand physically smaller packages. On the other hand, their power dissipation has not scaled down to quite the same extent, so that heat dissipation limits the extent to which the packaging size can be decreased. Sophisticated techniques have been developed for cooling miniaturized equipment, but these techniques also tend to be expensive and complicated.

One packaging approach which has many electrical and structural advantages places two cages of cards or books in an enclosure back to back on both sides of a backplane bus, so that the books plug into parallel sockets on both sides of the backplane. This decreases the electrical length of the bus, allowing faster operation. It provides a structurally compact unit, having a high ratio of usable volume to surface area. This approach, however, creates cooling problems. The conventional method, drawing air in a straight line from the top of the cage and through the books and the bottom of the cage into a fan and thence to an exhaust port, requires large spaces at the top and bottom of the cage for air inlet and exhaust. Designs without relatively large plenums typically experience high pressure losses (high impedance), poor airflow distribution (hot spots), and high air velocity (higher noise levels). The double-sided backplane cannot feasibly be made mechanically porous enough to allow air flow though one set of books, the backplane, then the second set of books in a straight line.

SUMMARY OF THE INVENTION

The present invention provides apparatus for air-cooling a double row of individual electronics books or other individual units which plug into a central backplane. The apparatus is compact and inexpensive, yet it achieves a high degree of efficiency and avoids irregularities in the air flow. It also allows flexible arrangement of its components.

Basically, the invention uses an (upside down) omega-shaped air path. For component books having cooling openings top and bottom, air is inducted horizontally above the books, is then turned to flow vertically downward through one set of books and into a fan or other air-moving device (AMD). The fan exhausts air horizontally into a low plenum chamber under the other set of books. Plenum air is turned to flow vertically upward through the second set of books, and is then turned again to exhaust horizontally from the enclosure.

DRAWING

Figure 1:
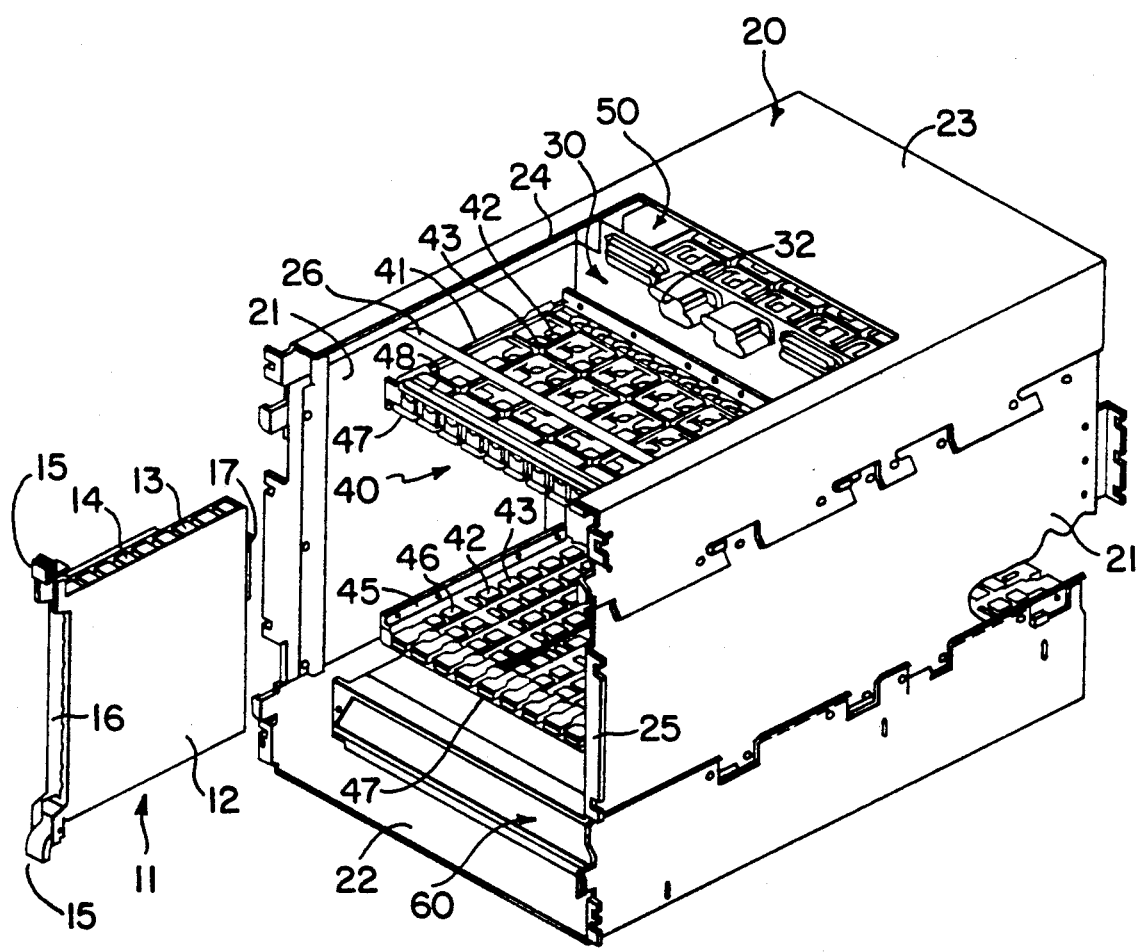
FIG. 1 shows apparatus for holding electronics components according to the preset invention.
Figure 4:
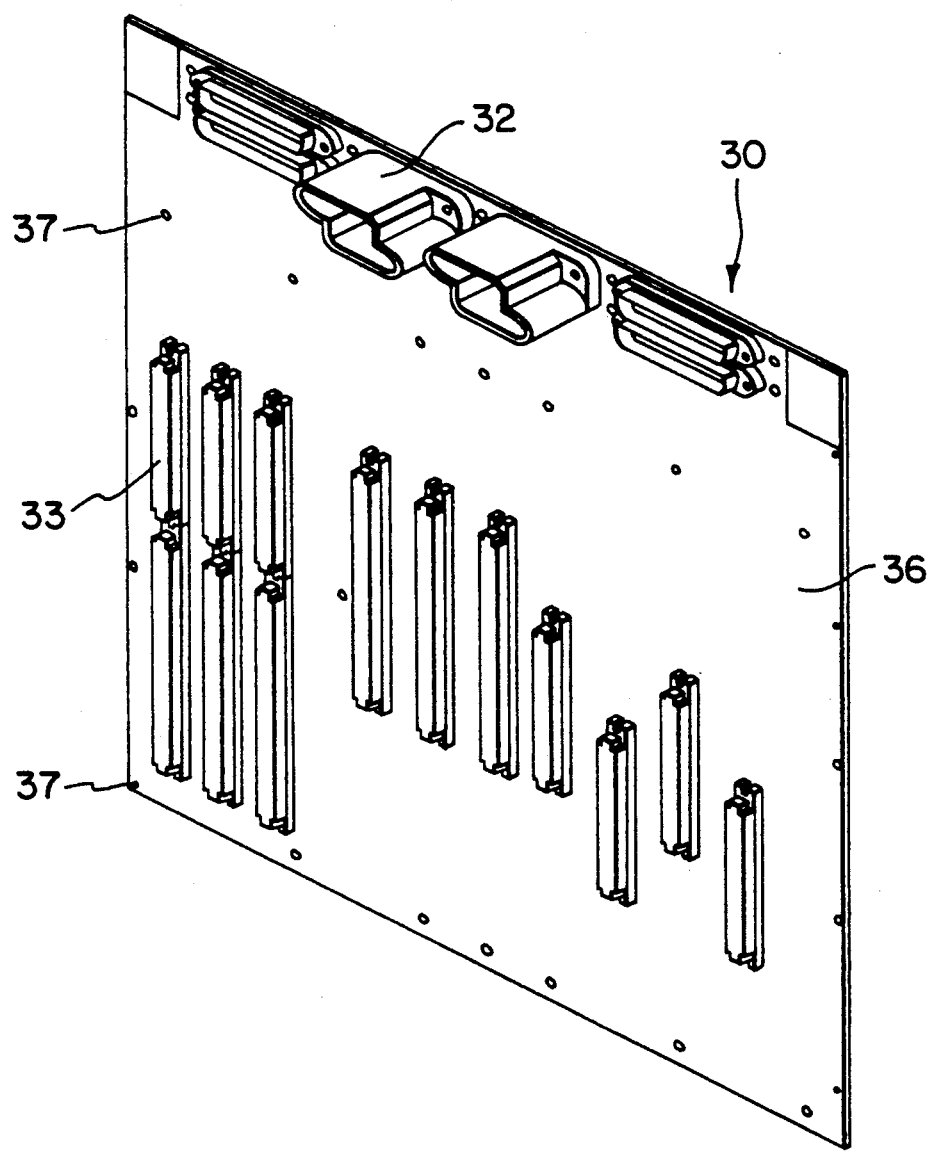

FIG. 4 a part of the backplane of FIG. 1.

Figure 5:
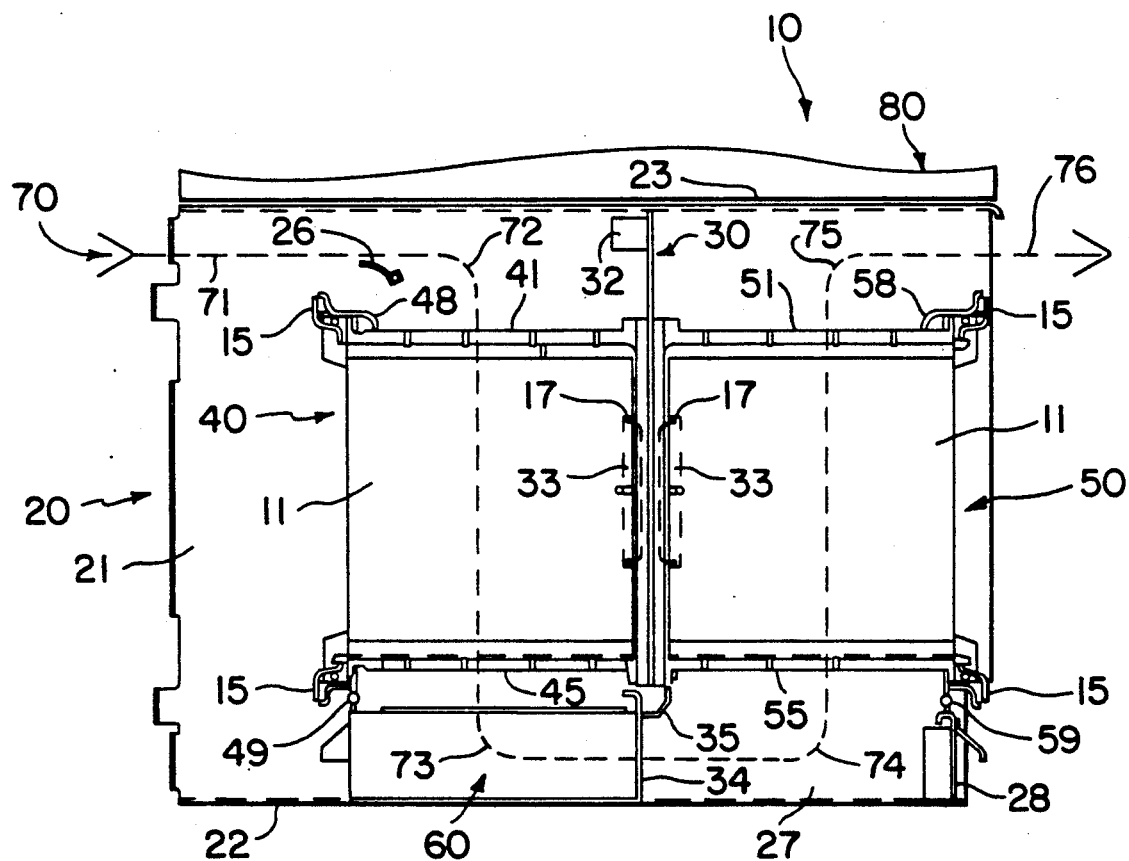

FIG. 5 is a side view of the apparatus of FIG. 1.

Figure 6:
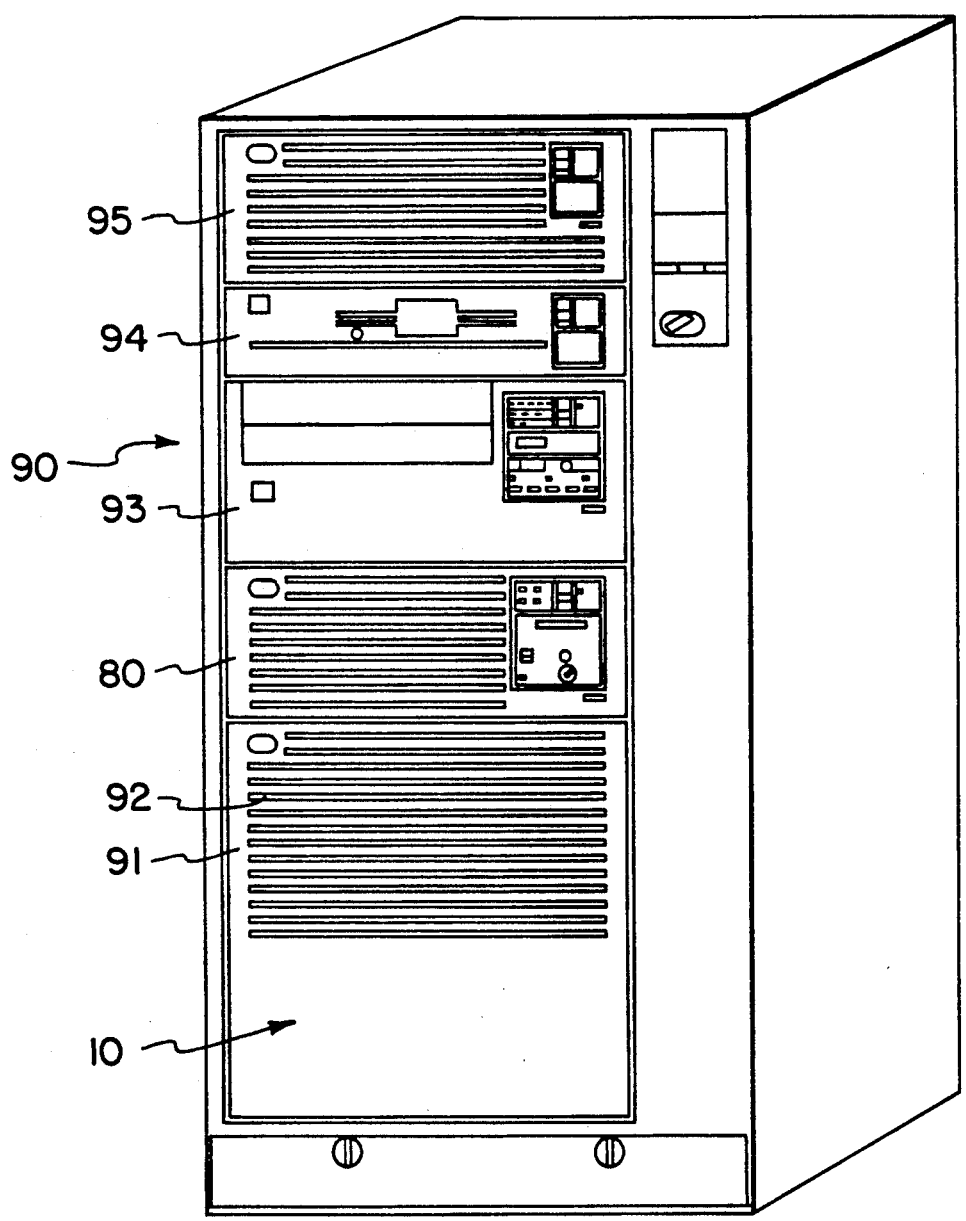

FIG. 6 illustrates a rack for a data-processing system in which the invention may be used.

DETAILED DESCRIPTION OF A PREFERRED EMBODIMENT

FIG. 1 is an isomeric view of apparatus 10 according to the invention. Its ultimate purpose is to hold a number of "books" 11 containing electronics components on circuit cards not shown. These cards are enclosed within solid metal or plastic side plates 12. Books 11 are shown in more detail in U.S. Pat. Nos. 4821,145 and 4,821,146; to Corfits et al. and Behrens et al. respectively. Identical top and bottom plates 13 contain rectangular openings 14 for admitting and exhausting cooling air; side plates 12 then guide the air around the circuit cards and their components. Plastic spring latches 15 at a rear book wall 16 hold books 11 in place, while connector 17 makes all necessary electrical connections to a backplane bus.

A metallic outer enclosure 20 surrounds the apparatus to provide overall structural support and electromagnetic shielding in addition to constraining the flow of air to a desired path. Although side walls 21 contain a number of separate pieces, they form a pair of solid vertical surfaces which are impervious to the flow of air; that is, they prevent air inside the enclosure from escaping to the sides. Bottom wall 22 also forms a solid barrier to the flow of air. In this embodiment, a single sheet of metal forms the bottom and a portion of the side walls. Top wall 23 is also integral with a portion of the side walls. The top wall constrains air flow at the rear of enclosure 20; a separate enclosure, overlying enclosure 10 and shown at 80 in FIG. 5, provides a solid surface for constraining air flow at the front of the enclosure, where top wall has a large recess 24. Tabs such as 25 provide mounting points for holding the entire apparatus 10 in a larger assembly such as rack 90. FIG. 6.

Backplane 30 divides enclosure 10 vertically into front and rear compartments. Its fit within enclosure 20 and its solid construction cause it to block any substantial air flow (as well as electromagnetic radiation) between the front and the rear compartments, except in a lower area. An upper portion contains connectors such as 32 for making electrical connections to units in enclosure 80. FIG. 5. The larger lower are of backplane 30 contains a number of vertical parallel connectors 33, FIG. 4, on both sides. These connectors receive the connectors 17 of books 11, and are placed opposite each other on the two sides of the backplane. The backplane does not extend all the way to bottom wall 22.

A front cage 40 occupies the front compartment of enclosure 20. An upper member 41 is a metal casting having an array of substantially rectangular openings such as 42. These openings match the dimensions of openings 14 in the books 11, so that they are aligned with each other when books 11 are fully inserted into cage 40. (The openings should be smaller than about 25mm so as to prevent radiation of electromagnetic energy from the interior of books 11.) To facilitate the flow of air, the ribs 43 which define them preferably have a teardrop cross section, rounded on top and tapered on the bottom A flange 44 on member 41 attaches it to backplane 30. A lower member 45 contains openings 42 and ribs 43 similar to those of member 41. Both members also contain longitudinal guides such as 46 which guide and hold books 11 in position for mating connectors 17 to backplane connectors 33. Conventional latch hooks such as 47 engage latches 15 to lock the books 11 into front cage 40.

A rear cage 50 occupies the rear compartment of enclosure 20. Its construction is the same as that of the front cage. The books that it contains are identical to books 11, although they may be different sizes or configurations in other embodiments. A broken-away portion of side wall 21 shows a portion of the rear cage.

Members 41, 45, 51, and 55 are screwed to side walls 21, so as to mount cages 40 and 50, and thereby backplane 30, to the enclosure 20.

Air-moving device 60 is preferably an electrically powered fan unit; it may be of any convenient type.

Figure 2:
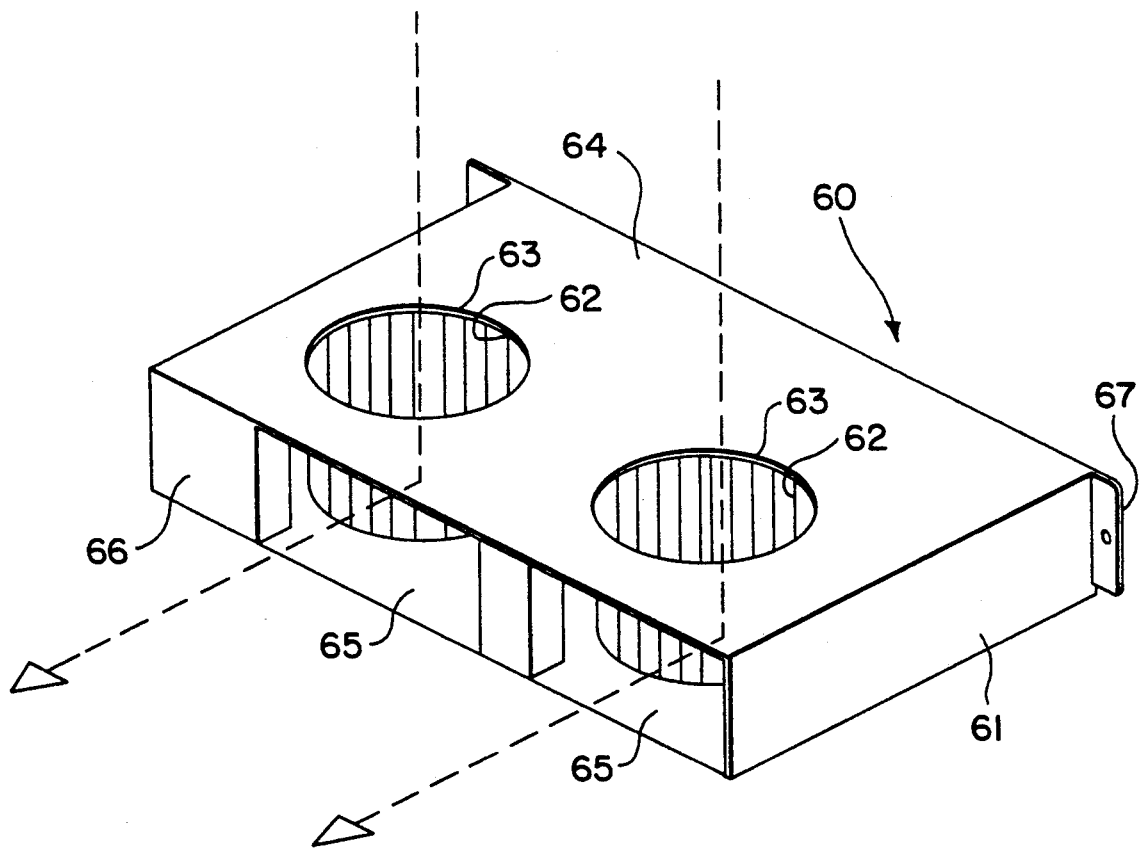
FIG. 2 shows an air-moving device for the apparatus of FIG. 1.

FIG. 2 is a rear view showing the air-moving device or fan 60 in more detail. Housing 61 contains one or more conventional impellers 62 having inlets 63 on a top surface 64, so that they draw air downward from the lower member of front cage 40. The impellers exhaust air through an opening 65 on the rear surface 66 of the fan housing. Any conventional fan or other air mover may be used; its type or structure is not at all critical. Using the cage-type blowers shown in FIG. 2, however, provides a free turn in the air path. Tabs 67 attach unit 60 to enclosure 20.

Figure 3:
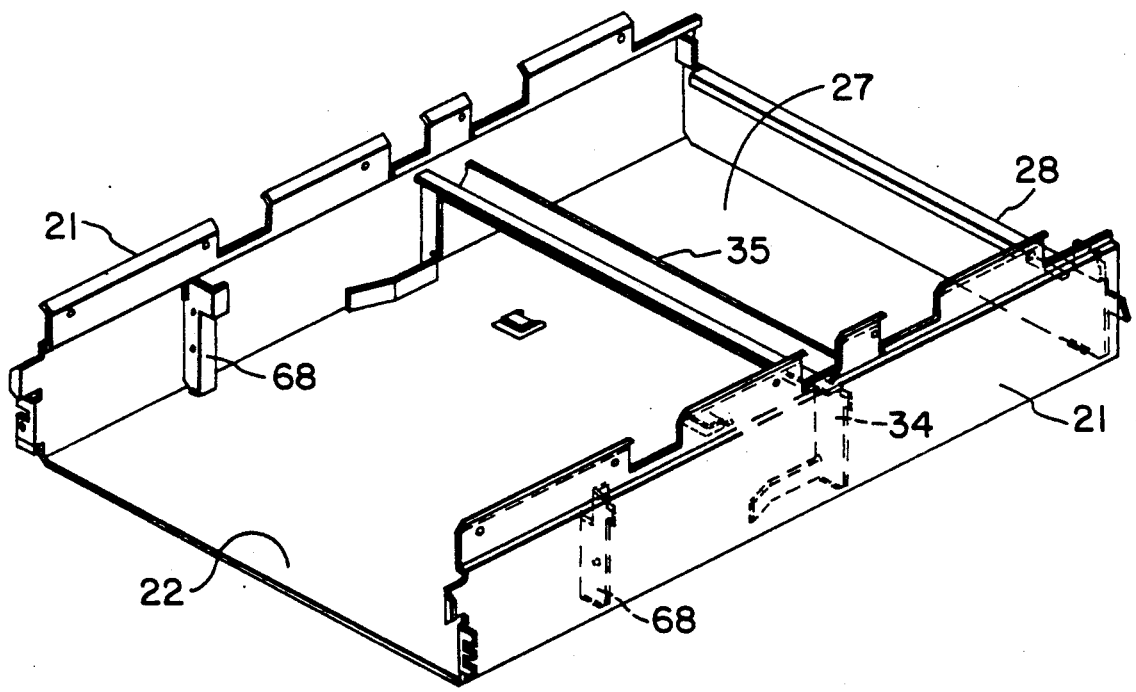
FIG. 3 is a phantom view of the bottom tray of FIG. 1.

FIG. 3 is a phantom view of the lower pan of enclosure 20, showing details which are not visible in FIG. 1. Fan unit 60 slides into enclosure 20 on bottom surface 22; tabs 67 are screwed to brackets 68, which are welded to side walls 21. Rear surface 66 abuts an interior wall 34 such that outlet opening 65 is aligned with a cutout in wall 34. This wall also has a formed radius 35 for turning the airflow in plenum chamber 27.

FIG. 4 shows details of the backplane 30 which are relevant to the invention. Panel 36 faces the front cage 40. FIG. 1, and attaches to upper and lower members 41 and 45 via the horizontal lines of holes 37. Connectors 32 couple to cables (not shown) from enclosure 80, FIG. 4. Connectors such as 33 receive mating connectors 17 on books 11. FIG. 1.

FIG. 5 is a schematic side view of apparatus 10 showing the air flow more clearly. (Books 11 are in place in both front and rear cages 40 and 50 in this view.) Dashed arrow 70 indicates the path of air flowing through the entire apparatus. Air is pulled into the open front of enclosure 20 horizontally at 71. A turning vane 26 (shown partially broken away in FIG. 1) is attached to side walls 21, and a radius 48 is mounted on upper member 41 for assisting the air in turning downward at 72, both ahead of and behind the vane. Radius 48 is an extrusion which also holds latch hooks 47. The vane and radius are conventionally dimensioned and positioned so as to minimize hot spots within books 11.

The air then flows vertically through member 41, books 11, and member 45, and thence into inlets 63 of fan unit 60, FIG. 2. A flexible strip 49 attached to lower member 45 acts as a seal to prevent air loss between cage 40 and unit 60.

The fan impellers turn the air again at 73 and push it through outlet 65 into a plenum chamber 27 formed by walls 21 and 22. Backplane 30 ends just below lower members 45 and 55, so that it does not block air flow from outlet 65. A short wall 28 closes the rear of the plenum. This wall is preferably has a block of acoustic foam glued to a piece of metal for absorbing sound. A flexible strip 59 seals wall 28 to lower member 55 of rear cage 50. A short wall 34 under backplane 30 and attached to side walls 21 has an opening (not shown) the same size and location as outlet 65. It also contains a formed radius 35 to assist the air in turning upward at 74. The preheated air then flows upward through member 55, books 11, and member 51. Radius 58 helps it turn again at 75, to exit horizontally through the rear of enclosure 20 at 76.

The air path as described has four turns. However, the air-moving device 60 provides one turn free, and the other three can be easily aided by radii and turning vanes without adding excessive headroom. The plenum chamber 27 for reducing impedance requires no additional room, since it merely uses height already required for the airmoving device. The design is also flexible in that a second air-moving device could be placed in the plenum chamber, for a higher capacity in the same enclosure dimensions, although this would lose the height advantage of the invention by requiring a downward exhaust from the enclosure.

FIG. 6 illustrates a rack 90 for holding an entire data-processing system. Apparatus 10 holds the central electronics complex (CEC) for this system. It is mounted behind panel 91, which has louvers 92 for admitting ambient air into the front cage 40 FIG. 1, as previously described. Enclosure 80, which holds other electronics components, sits immediately above apparatus 10. Other enclosures such as 93-95 occupy other positions in the rack.

In this embodiment, the apparatus 10 is adapted for holding books 11, FIG. 1, vertically in a particular position. Other orientations and positions are obviously possible. Additional variations within the scope of the invention suggest themselves from the foregoing description.

Having described one of a number of embodiments thereof, we claim as our invention:

1. Apparatus for cooling electronics components attached to multiple planar units each having a planar unit connector, said enclosure comprising:
 a backplane having front and rear sides each carrying a plurality of connectors all coupled together via electrical conductors to form a bus, said backplanes being substantially impervious to the flow of air between its front and rear sides;
 a front cage assembly having upper and lower members containing arrays of openings, and means for holding and positioning said planar units such that said planar unit connectors may engage respective ones of said backplane connectors on said front side of said backplane, said members being positioned adjacent the front side of said backplane;
 a rear cage assembly having upper and lower members containing arrays of openings, and means for holding and positioning said planar units such that said planar unit connectors may engage respective ones of said backplane connectors on said rear side of said backplane, said members being positioned adjacent the rear side of said backplane;
 an enclosure surrounding both said cages and said backplane and having a pair of solid side walls positioned against said upper and lower members and against said backplane, said enclosure having a solid top wall attached to said side walls and positioned against said backplane so as to prevent air flow between the front and rear of said backplane, said enclosure further having a solid bottom wall attached to said side walls;

means for forming a plenum chamber bounded by said bottom wall, portions of said side walls, and the bottom member of said rear cage;

a powered air mover having an inlet for receiving air flowing through the lower member of said front cage, and having an outlet for exhausting air into said plenum chamber, said air mover creating a flow of air from the upper member of said front cage through the lower member of said front cage, through said air mover and said plenum chamber, thence from said lower member of said rear cage through the upper member of said rear cage in an omega-shaped path having at least four turns.

2. Apparatus according to claim 1, wherein said books have solid side walls and openings at their tops and bottoms for the flow of cooling air through said books.

3. Apparatus according to claim 2, wherein the openings in said members approximately match the dimensions and locations of the opeings in said books.

4. Apparatus according to claim 2, wherein the openings in said members form a rectangular array.

5. Apparatus according to claim 4, wherein the openings in said members are approximately rectangular in shape.

6. Apparatus according to claim 1, further including means located at at least one of said turns for turning said air flow through a right angle.

7. Apparatus according to claim 6 wherein said turning means includes a vane.

8. Apparatus according to claim 6, wherein said turning means includes a plurality of formed radii located at a plurality of said turns.

9. Apparatus according to claim 1, wherein said air mover provides one of said turns.

10. Apparatus according to claim 1, further including means for releasably sealing said air mover to said front cage.

11. Apparatus according to claim 1, wherein said plenum chamber has approximately the same height as said air mover, and is located horizontally adjacent thereto.

12. Apparatus according to claim 1, wherein each of said planar units comprises a circuit card housed within a book.

* * * * *

UNITED STATES PATENT AND TRADEMARK OFFICE
CERTIFICATE OF CORRECTION

PATENT NO. : 5,027,254

DATED : June 25, 1991

INVENTOR(S) : W D Corfits, et al

It is certified that error appears in the above-indentified patent and that said Letters Patent is hereby corrected as shown below:

At column 5, line 26, "opeings" should read --openings--.

Signed and Sealed this

Twenty-third Day of November, 1993

Attest:

BRUCE LEHMAN

Attesting Officer     Commissioner of Patents and Trademarks